(12) United States Patent
Uda et al.

(10) Patent No.: US 6,962,770 B2
(45) Date of Patent: Nov. 8, 2005

(54) METHOD OF MANUFACTURING AN ELECTROCONDUCTIVE FILM, AND AN APPARATUS INCLUDING IT

(75) Inventors: Yoshimi Uda, Kanagawa (JP); Kazuya Ishiwata, Kanagawa (JP); Shinsaku Kubo, Kanagawa (JP); Yasuyuki Watanabe, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/951,612

(22) Filed: Sep. 14, 2001

(65) Prior Publication Data

US 2002/0031728 A1 Mar. 14, 2002

(30) Foreign Application Priority Data

Sep. 14, 2000 (JP) .......................... 2000/280505

(51) Int. Cl.[7] .............. G03F 7/20; G03F 7/16; G03F 7/22; G03F 7/26; G03F 7/40
(52) U.S. Cl. ................. 430/311; 430/312; 430/313; 430/315; 430/319; 430/330; 430/394
(58) Field of Search .................. 430/311, 320, 430/330, 394, 312–313, 315, 319

(56) References Cited

U.S. PATENT DOCUMENTS 4,223,083 A * 9/1980 Engstrom ................. 430/24
5,839,363 A   11/1998 Yanagisawa et al. ....... 101/123
5,874,197 A * 2/1999 Felten ..................... 430/281.1
6,426,733 B1 * 7/2002 Yamada ................... 345/74.1

FOREIGN PATENT DOCUMENTS

JP   06077106 A  * 3/1994  ......... H01L/21/027
JP   8-34110       2/1996
JP   08227153 A  * 9/1996  ........... G03F/7/027

OTHER PUBLICATIONS

English Translation of JP 08–227153 A to Masaki, et al. already cited on previous PTO–892 of Paper No. 7.*

* cited by examiner

Primary Examiner—Mark F. Huff
Assistant Examiner—John Ruggles
(74) Attorney, Agent, or Firm—Fitzpatrick, Cella, Harper & Scinto

(57) ABSTRACT

In a method of manufacturing an electroconductive film, a developing process is implemented on a photosensitive paste layer (12) having a height of about 13 μm in a state where exposure is repeated twice in FIG. 1D, and thereafter, a baking process is completed to form a wiring pattern (20). As a result, the curling of an edge formed in the wiring pattern (20) can be remarkably reduced.

9 Claims, 13 Drawing Sheets

FORMING FILM → DRYING → EXPOSURE → FORMING FILM → DRYING → EXPOSURE → DEVELOPING → BAKING

FORMING FILM → DRYING → EXPOSURE → FORMING FILM → DRYING → EXPOSURE → FORMING FILM → DRYING → EXPOSURE → DEVELOPING → BAKING

FORMING FILM → DRYING → EXPOSURE → FORMING FILM → DRYING → EXPOSURE → DEVELOPING → BAKING

FORMING FILM → DRYING → EXPOSURE → FORMING FILM → DRYING → EXPOSURE → FORMING FILM → DRYING → EXPOSURE → DEVELOPING → BAKING

FORMING FILM → DRYING → EXPOSURE → FORMING FILM → DRYING → EXPOSURE → DEVELOPING → BAKING

METHOD OF MANUFACTURING AN ELECTROCONDUCTIVE FILM, AND AN APPARATUS INCLUDING IT

BACKGROUND OF THE INVENTION

1. Field of the Invention

The present invention relates to a method of manufacturing an electroconductive film and the image-forming apparatus including the electroconductive film.

A conventional surface conduction electron-emitting device is shown in FIGS. 11A and 11B. FIG. 11A is a schematic plane view showing a conventional electron-emitting device, and FIG. 11B is a schematic cross-sectional view taken along a line 11B—11B in FIG. 11A.

Referring to FIGS. 11A and 11B, reference numeral 11 denotes an insulating substrate, 7 denotes an electron emission electroconductive film, 2 and 3 denote electrodes, and 8 denotes an electron-emitting portion.

FIG. 12 is a schematic structural view showing an example of an image display device as an image-forming apparatus using the electron-emitting device such as the surface conduction electron-emitting device shown in the above-mentioned FIGS. 11A and 11B.

In FIG. 12, reference numeral 81 denotes a substrate, 82 denotes an outer frame, and 86 denotes a face plate in which an image forming member 84 is disposed. The respective connecting portions of the outer frame 82, the substrate 81 and the face plate 86 are sealed with an adhesive such as a low melting point glass frit (not shown) to structure an envelope (air tight vessel) 88 for maintaining the interior of the image display device in a vacuum state.

A substrate 11 is fixed on the substrate 81. On the substrate 11 are arranged n×m electron-emitting devices 74 (n and m are positive integers of 2 or more and appropriately set in accordance with the number of target display pixels).

Also, the respective electron-emitting devices 74 are connected to wirings 4 and 6 formed of electroconductive films. The wirings in FIG. 12 are formed of m column-directional wirings 4 and n row-directional wirings 6 (also called "matrix wiring"). An insulating layer (not shown) is disposed on each cross portion of the row-directional wirings 6 and the column-directional wirings 4 to insulate the row-directional wirings 6 and the column-directional wirings 4 from each other.

In formation of the above image display device, it is necessary to form a large number of row-directional wirings 6 and column-directional wirings 4.

As a method of arranging and forming a large number of row-directional wirings 6 and column-directional wiring 4, a method of forming wirings of electroconductive films by using a printing technique which is relatively inexpensive, does not require a vacuum device or the like and can cope with a large area is disclosed in Japanese Patent Application Laid-open No. 8-34110 and the like.

In order to make the image-forming apparatus such as the above image display device higher in its precision, it is necessary to form the wirings formed of the electroconductive film that supplies an electricity to the respective electron-emitting devices to drive the respective electron-emitting devices with higher precision.

Under the above circumstances, in formation of the above wirings, a method using photosensitive paste has been proposed.

Also, in a case of fabricating a large-area image-forming apparatus having a diagonal of several tens of centimeters in length, it is necessary to make the wirings used in the interior of the image-forming apparatus lower in resistance. To achieve this, it is important to make the film thickness of the wirings thick.

However, in a case of using the photosensitive paste for the purpose of forming the thick wirings with high precision, there arise the following problems.

In general, a process of fabricating the wirings in the case of using the photosensitive paste is conducted in a stated order of forming of the photosensitive paste film, (drying), exposing, developing and burning.

However, in the case of fabricating the wirings by forming a thick photosensitive paste film, then sequentially implementing (drying), exposing, developing and baking processes for the purpose of forming the thick film, there arise the following problems.

That is, in FIGS. 13A to 13D where reference numeral 11 denotes a substrate, 12 denotes a photosensitive paste, 13 denotes a mask, 14 denotes an exposed light, 15 denotes a latent image, 19 denotes a developed image pattern and 21 denotes a completed wiring pattern, FIG. 13A shows a film forming process, FIG. 13B is an exposure process, FIG. 13C is a developing process and FIG. 13D is a baking process. In the case of fabricating the wirings in that order, a curl of an edge portion of the wiring pattern 21 that has been baked such as warping (hereinafter, referred to as "edge curl") increases, and in further laminating an insulating layer on the wiring pattern in a succeeding process, spaces defined on both sides of the wiring pattern 21 under the edge curl portions are insufficiently filled with an insulating material, thereby coming to a state where spaces remain there.

It is presumed that this is caused by a reduction of volume resulting from evaporating a solvent or the like in the baking process of FIG. 13D, or the short of the amount of exposure at the time of exposing a light because of the thick photosensitive paste.

On the other hand, if the amount of exposure is increased to eliminate the short of the amount of exposure, a so-called over exposure is exhibited, resulting in cases where the sharpness of the edge portion of the wiring pattern 21 becomes low, or patterning is made with a width wider than a desired width.

Also, in forming a matrix wiring (row-directional wirings and column-directional wirings) used in an image display device shown in FIG. 12 among the wirings formed of the electroconductive film, in order to insulate the row-directional wirings and the column-directional wirings from each other, it is necessary that after a lower-layer wiring positioning at a lower side has been formed, an insulating layer is formed, and therefore an upper-layer wiring is laminated thereon.

For that structure, in the case of using a wiring with the above curled edge portions as the lower-layer wiring at the lower side, an insulating layer is formed on the lower-layer wiring with the curled edges.

In this situation, in forming the insulating layer through a printing method, the spaces on both sides of the lower-layer wiring at the lower-side of the curled edge portion cause bubbles to be produced in the insulating layer in the baking process required for the printing method.

As a result, the bubbles within the insulating layer deteriorate the insulating property between the row-directional wirings and the column-directional wirings, and in the worst case, there may occur such a problem that the row-directional wirings and the column-directional wirings are short-circuited.

Also, in the above-mentioned image-forming apparatus, a high voltage of several kV to several tens kV is applied to a metal back arranged in the face plate. For that reason, when a wiring (electroconductive film) with the above-mentioned curled edges exists on a facing rear plate, the possibility that a discharge phenomenon starting from the curled edge portions occurs becomes high.

The curled edges in question are remarkably observed when the film thickness of the photosensitive paste that has been baked exceeds 5 $\mu$m, and the amount of curled edge becomes larger as the film thickness becomes thick.

For example, in the case where the thickness of a portion A that has been baked in FIG. 13D is 10 $\mu$m, the curled edge which is the film thickness of a portion B in FIG. 13D becomes 18 to 21 $\mu$m.

The film thickness of the portion A exhibits a height of a portion except for the curled edge portion on the wiring pattern 21 end portion that has been baked from the substrate surface. The film thickness of the portion B exhibits a height of the curled edge portion of the wiring pattern 21 end portion.

For that reason, the curled amount of edge (B/A) is about twice. In the present specification, the curled amount of edge is directed to a ratio of B to A in FIGS. 13A to 13D, and in this case, that the curled amount of edge is about twice means B/A=(18/10) to (21/10)≅2.

If the curled amount of edge is thus about twice, in the case of forming the above-mentioned matrix wirings, the formation of the insulating layer which will be laminated in a following process is adversely affected due to only the height of the curled edge portion.

There is a case in which the curled amount of edge is equal to the thickness of substantially one layer of the insulating layer although depending on the thickness of the insulating layer, and in this case, the thickness of the substantially one insulating layer is canceled by the curled amount of edge.

For that reason, if a desired insulating performance is going to be obtained, it becomes necessary to form an excessively thicker insulating layer taking the curled amount of edge into consideration. In addition, as a result of forming the thicker insulating layer in formation of the upper-layer wiring at the upper side after the insulating layer has been formed, an excessive step is formed, resulting in the disconnection of the upper-layer wiring at the upper side.

Also, on terminals (lead-out) of the wirings in the image-forming apparatus, in the case where there are the curled edge portion, if flexible mounting is going to be conducted, the curled edge portion may be destroyed or a contact failure may occur.

SUMMARY OF THE INVENTION

The present invention has been made in order to solve the above-mentioned problems of the conventional art, and therefore an object of the present invention is to provide methods of manufacturing an electroconductive film, a circuit substrate, an electron source and an image-forming apparatus, and the electroconductive film, the circuit substrate, the electron source and the image-forming apparatus, which reduce the curling of edges.

In order to achieve the above object, according to a first aspect of the present invention, there is provided a method of manufacturing an electroconductive film, comprising the steps of:

forming a film containing a photosensitive material and an electroconductive material on a substrate;

conducting an exposure to form a latent image on the film formed in the film forming step by irradiating a light onto a desired region of the film in different exposures respectively at the center area and peripheral area of the desired region;

conducting a development to form a development image of the film by removing a non-latent image region of the film after said exposing step; and baking the development image formed in said developing step.

Also, according to a second aspect of the present invention, there is provided a method of manufacturing an electroconductive film, comprising the steps of:

sequentially repeating a film forming step of forming a film containing a photosensitive material and an electroconductive material therein and an exposure step of irradiating a light onto a desired region of the film formed in the film forming step for a plurality of times to laminate the films on each other into a laminate film where the latent images of the respective layers are integrated into a laminate latent image;

developing the latent image into a development image by removing a non-latent image region of the laminate film after the formation of the laminate film together; and baking the development image formed in the developing step.

Further, according to a third aspect of the present invention, there is provided a method of manufacturing an electroconductive film, comprising the steps of:

forming a film containing a photosensitive material and an electroconductive material therein on a substrate as a film forming step;

irradiating a light onto a desired region of the film containing the photosensitive material and the electroconductive material therein which has been formed in the film forming step for a plurality of times as an exposure step;

removing a non-exposed region where the photosensitive material is a negative type or an exposed region where the photosensitive material is a positive type exposed in the exposure step of the film having the exposed region and the non-exposed region as a developing step; and baking the film which has been subjected to the developing step.

Still further, according to a forth aspect of the present invention, there is provided a method of manufacturing an electroconductive film, comprising the steps of:

Sequentially repeating a film forming step of forming a film containing a photosensitive material and an electroconductive material therein on a substrate and an exposure step of irradiating a light onto a desired region of the film containing the photosensitive material and the electroconductive material formed in the film forming step for a plurality of times to form a laminate film into which a plurality of films each having an exposed region and a non-exposed region are laminated;

removing the non-exposed region of said laminate film where the photosensitive material is a negative step or the exposed region of the laminate film where the photosensitive material is a positive type; and baking the laminate film that has been subjected to the developing step.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Hereinafter, a description will be given in more detail of preferred embodiments of the present invention with reference to the accompanying drawings. The present invention is not limited to the dimensions, the materials, the shapes and the relative arrangement of the structural parts, etc., described in this embodiment so far as no specific description is made.

The terms described in the related art among terms used in the following description are employed with the same meanings. Also the "photosensitive paste" in the present invention is directed to a paste material containing at least an electroconductive material composed of a simple substance or compound of metal such as silver or copper which functions as a wiring (electroconductive film) material, a photosensitive material having a photosensitive characteristic and a solvent. Also, glass grains, a sensitizer or the like is appropriately added to the above materials for the above-mentioned "photosensitive paste".

In addition, an example of using a photosensitive paste whose photosensitive characteristic is negative (a light irradiated portion is insolubilized) will be described below. However, in the present invention, there may be used a photosensitive paste whose photosensitive characteristic is positive (a light irradiated portion is solubilized).

(First Embodiment)

Figure 1A:
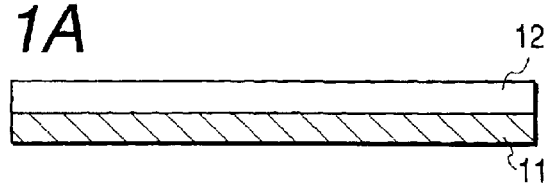
FIGS. 1A, 1B, 1C, 1D and 1E are diagrams showing processes of a method of manufacturing a wiring in accordance with a first embodiment of the present invention.
Figure 1B:
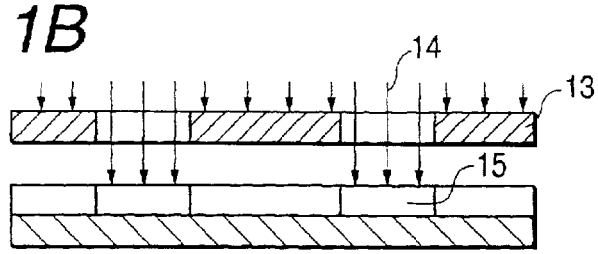
Figure 1C:
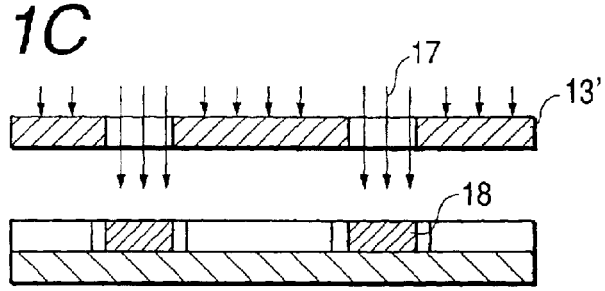
Figure 1D:
Figure 1E:

FIGS. 1A to 1E are schematic views showing a process of manufacturing a wiring (electroconductive film) in accordance with a first embodiment. FIG. 1A is a diagram showing a state in which a photosensitive paste film has been formed; FIG. 1B is a diagram showing a state in which exposure is made; FIG. 1C is a diagram showing a state in which second exposure is made; FIG. 1D is a diagram showing a state in which developing has been made; and FIG. 1E is a diagram showing a state in which baking has been made.

Referring to FIGS. 1A to 1E, reference numeral 11 denotes a substrate; 12 denotes a layer which is a film formed by coating a photosensitive paste on the substrate 11; 13 denotes a mask used for irradiating a light onto only a desired region of the layer 12; 14 and 17 denote exposure lights; 15 and 18 denote latent images formed by exposure; 19 denotes a developing pattern with a developer; and 20 denotes a completed wiring pattern (electroconductive film).

Hereinafter, a method of forming a wiring (electroconductive film) on the substrate 11 will be described.

FIGS. 1A to 1E show a film forming process, an exposure process, a developing process, and a baking process in the stated order. In FIG. 1A, the substrate 11 is made of soda lime glass, and the layer 12 is formed on the substrate 11 by using a photosensitive paste. That is, the layer 12 which is a film containing the photosensitive material and the electroconductive material therein is formed on the substrate 11.

The photosensitive paste mainly contains silver as the electroconductive material which includes silver grains of about 60 to 80% as well as an organic component having a photosensitivity and glass frit and a solvent component of about 20 to 40% as the photosensitive material. A film made of the photosensitive paste having the electroconductive material is formed on the substrate 11 through a screen printing method.

Plates having a roughness of around #150 to 400 are selectively used in accordance with a desired final thickness. In this example, in order to set the thickness of the layer 12 that has been dried to 12 $\mu$m or more, a plate #200 in roughness is used to form a film.

Thereafter, for the purpose of drying the photosensitive paste, drying is implemented at about 80 to 150° C. The thickness of the layer 12 which has been dried is about 13 $\mu$m.

Subsequently, in FIG. 1B, a mask 13 having an opening portion of a desired wiring pattern is disposed, and the layer 12 whose photosensitive paste has been dried is exposed.

In this situation, an exposure light 14 passes through an opening portion of the mask 13 to expose the photosensitive paste layer 12 as shown in the figure. Reference numeral 15 denotes a latent image which is an exposed portion of the photosensitive paste.

Then, in FIG. 1C, in the same method as that of the first exposure, alignment is made such that the center of the first pattern (exposed region) is superimposed on the second pattern (exposed region), and the second exposure is conducted by using a mask 13' smaller in opening portion than the mask 13 used in the first exposure. Reference numeral 18 denotes a latent image which is a portion of the photosensitive paste that has been subjected to the second exposure. As the results of the above process, the central region of the wiring pattern where the second exposure has been conducted is strongly exposed and the peripheral region of the wiring pattern where the first exposure has been conducted is weakly exposed, so that a latent image having different exposures is formed in the conductive film.

In the state where the exposure is repeated twice as described above, the developing process is implemented on the photosensitive paste layer 12 having a height of about 13 µm in FIG. 1D.

Although developing differs depending on a photosensitive paste to be used, after developing has been made by an alkalescent solvent, the developing stops by a pure-water rinse and drying is implemented by blowing, to thereby form a developing pattern 19 shown in the figure.

In addition, as shown in FIG. 1E, a desired wiring pattern 20 is formed by baking. In this case, the baking is implemented at about 500° C. The thickness of the wiring pattern 20 that has been baked is about 7 µm.

In this case, the lowest portion of the thickness of the wiring pattern 20 in its section is about 7 µm on the center portion whereas the highest portion is about 8 to 10 µm on the end portion. The wiring pattern 20 can be formed with the curled amount of edge of about 1.1 to 1.4 times.

The developing process and the subsequent processes are proceeded in a state where the latent image comprising areas in different exposures is formed, thereby being capable of remarkably reducing the curling of the edge formed in the wiring pattern 20.

Because the edge curl is reduced in this way, in the case where the manufacturing method according to this embodiment is applied to the matrix wiring, because the curled amount of edge is small even if the insulating layer is formed on the lower-layer wiring, the generation of bubbles in the insulating layer is lessened, and the generation of the hole or the growth of the bubbles is reduced even in the laminate layer.

Also, even if an upper-layer wiring is further formed on the insulating layer, the insulating property of the insulating layer is excellent, and defects that lead to short-circuiting are remarkably reduced.

Also, because the curing of edge is reduced, the insulating layer having a sufficient insulating property can be formed without increasing the number of insulating layers which will be laminated on each other in a following process.

Also, even in the formation of the upper-layer wiring on the insulating layer, there is no case in which the disconnection of the upper-layer wiring occurs at the step due to the curled edge.

Also, because the buildup of the curled edge portion is small even in the end portion (terminal portion) of the wiring, even if flexible mounting is conducted, a damage on the wiring such as crack does not occur and the contact failure does not also occur.

Also, there arises no problem that the line of the wiring is cracked even if the flexible board is replaced by a new one.
(Second Embodiment)

Figure 2A:
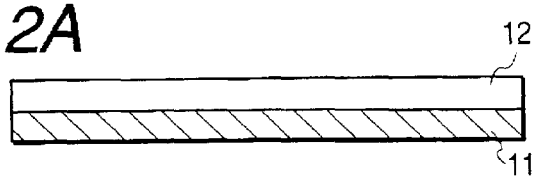
FIGS. 2A, 2B, 2C, 2D, 2E and 2F are diagrams showing processes of a method of manufacturing a wiring in accordance with a second embodiment of the present invention.
Figure 2B:
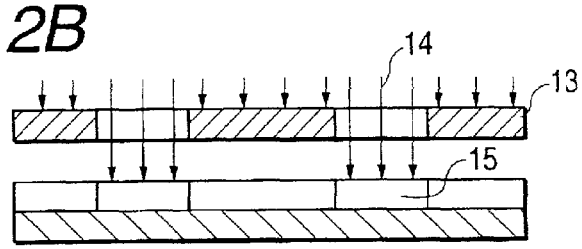
Figure 2C:
Figure 2D:
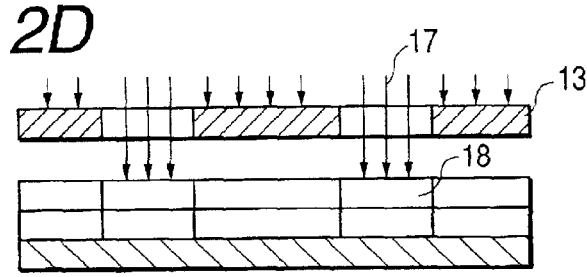
Figure 2E:
Figure 2F:

FIGS. 2A to 2F are diagrams showing a process of manufacturing a wiring in accordance with a second embodiment. FIG. 2A is a diagram showing a state in which a photosensitive paste film has been formed; FIG. 2B is a diagram showing a state in which exposure has been made; FIG. 2C is a diagram showing a state in which a second layer film has been formed; FIG. 2D is a diagram showing a state in which the second layer has been exposed; FIG. 2E is a diagram showing a state in which developing has been made; and FIG. 2F is a diagram showing a state in which baking has been made.

Referring to FIGS. 2A to 2F, reference numeral 11 denotes a substrate; 12 and 16 denote first and second layers each formed by coating a photosensitive paste on the substrate 11; 13 denotes a mask; 14 and 17 denote exposure lights; 15 and 18 denote latent images; 19 denotes a developing pattern; and 20 is a wiring pattern.

Hereinafter, a method of forming a wiring on the substrate of the present embodiment will be described.

FIGS. 2A to 2F show a film forming process, an exposure process, a film forming process, an exposure process, a developing process, and a baking process in the stated order.

In FIG. 2A, the substrate 11 is made of soda lime glass, and the photosensitive paste layer (hereinafter referred to as "first layer") 12 is formed on the substrate 11.

The photosensitive paste mainly contains silver and includes silver grains or about 60 to 80% as well as a glass component, an organic component having a photosensitivity and glass frit and a solvent component of about 20 to 40%. A film made of the photosensitive paste having the electroconductive property is formed on the substrate 11 through a screen printing method.

Plates having the roughness of around #150 to 400 are selectively used in accordance with a desired final thickness. In this example, in order to set the thickness of the first layer 12 that has been dried to 10 µm or more, a plate #325 in roughness is used to form a film.

Thereafter, for the purpose of drying the photosensitive paste, drying is implemented at about 80 to 150° C. The thickness of the first layer 12 which has been dried is about 11 µm.

Subsequently, in FIG. 2B, the mask 13 having an opening portion of a desired wiring pattern is disposed so that the desired region of the first layer 12 of the dried photosensitive paste is exposed, and the desired region of the first layer 12 is then exposed.

In this situation, an exposure light 14 passes through the opening portion of the mask 13 and exposes the first layer 12 of the photosensitive paste as shown in the figure. Reference numeral 15 denotes a latent image which is an exposed portion of the photosensitive paste of the first layer 12.

Then, in FIG. 2C, the second layer photosensitive paste layer (hereinafter referred to as "second layer") 16 is formed in the same method as that of the first layer 12, and thereafter drying is implemented in the same manner as that of the first layer 12. The thickness of the total layer (the first layer 12+ the second layer 16) of the photosensitive paste which has been dried is about 22 µm in total.

Then, in FIG. 2D, alignment is made so that the pattern (exposed region) 15 of the first layer 12 is superimposed on the exposed region of the second exposed region, and exposure is made by using the same mask as that used in the process of exposing the first layer 12.

In this situation, as shown in the figure, the exposure light 17 passes through the opening portion of the mask 13 and exposes the second layer 16 of the photosensitive paste. Reference numeral 18 denotes a latent image which is a portion of the photosensitive paste of the second layer 16 that has been subjected to the second exposure.

In this way, the film forming process to the exposure process are repeated twice. The above processes are a process of forming a laminate film, and the latent images 15 and 18 are also laminated on each other.

After the laminate film of the two-layer structure has been formed, the total layer (the first layer 12+ the second layer 16) of the photosensitive paste which is about 22 µm in height is developed together in FIG. 2E.

Although developing differs depending on a photosensitive paste to be used, after developing has been made by an alkalescent solvent, the developing stops due to a pure-water rinse and drying is implemented by blowing, to thereby form a developing pattern 19 shown in the figure.

In addition, as shown in FIG. 2F, a desired wiring pattern 20 is formed by baking. In this case, the baking is implemented at about 500° C. The thickness of the wiring pattern 20 that has been baked is about 14 μm.

In this case, the lowest portion of the thickness of the wiring pattern 20 in its section is about 14 μm on the center portion whereas the highest portion is about 17 to 18 μm on the end portion. The wiring pattern 20 can be formed with about 1.2 to 1.3 times the curled amount of edge.

In this way, the film forming process to the exposure process are repeated twice, and the developing process is proceeded together in the state of the two-layer structure, thereby being capable of remarkably reducing the curling of edge.

The wiring according to this embodiment where the curing of edge is reduced is not subjected to a short-circuiting defect between the lower-layer wiring and the upper-layer wiring even if the wiring is applied to the matrix wiring.

Also, because the curing of edge is reduced, the insulating layer having a sufficient insulating property can be formed without particularly increasing the number of insulating layers which will be laminated on each other in a following process. As a result, even in the formation of the upper-layer wiring on the insulating layer, there is no case in which the disconnection of the upper-layer wiring occurs at the step due to the curled edge.

(Third Embodiment)

Figure 3A:
FIGS. 3A, 3B, 3C, 3D, 3E, 3F, 3G and 3H are diagrams showing processes of a method of manufacturing a wiring in accordance with a third embodiment of the present invention.
Figure 3B:
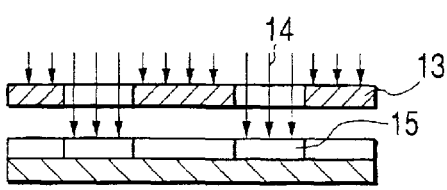
Figure 3C:
Figure 3D:
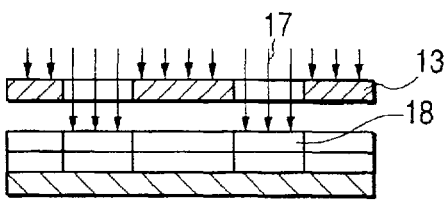
Figure 3E:
Figure 3F:
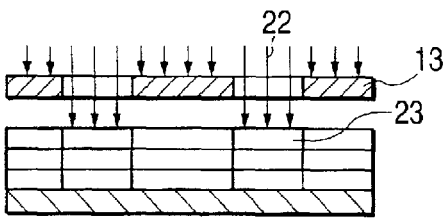
Figure 3G:
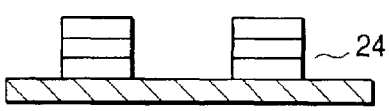
Figure 3H:

FIGS. 3A to 3H are schematic views showing a process of manufacturing a wiring in accordance with a third embodiment. FIG. 3A is a diagram showing a state in which a photosensitive paste film has been formed; FIG. 3B is a diagram showing a state in which exposure has been made; FIG. 3C is a diagram showing a state in which a second layer film has been formed; FIG. 3D is a diagram showing a state in which the second layer has been exposed; FIG. 3E is a diagram showing a state in which a third layer has been formed; FIG. 3F is a diagram showing a state in which the third layer has been exposed; FIG. 3G is a diagram showing a state in which developing has been made; and FIG. 3H is a diagram showing a state in which baking has been made.

Referring to FIGS. 3A to 3H, reference numeral 11 denotes a substrate; 12, 16 and 21 denote first, second and third layers each formed by coating a photosensitive paste on the substrate 11; 13 denotes a mask; 14, 17 and 22 denote exposure lights; 15, 18 and 23 denote latent images; 24 denotes a developing pattern; and 25 denotes a wiring pattern.

The processes shown in FIGS. 3A to 3D are implemented in the same manner as that of the second embodiment shown in FIGS. 2A to 2D.

In FIG. 3A, the substrate 11 is made of soda lime glass, and the first layer 12 made of the photosensitive paste is formed on the substrate 11.

The photosensitive paste mainly contains silver and includes silver grains of about 60 to 80% as well as a glass component, an organic component having a photosensitivity and a solvent component of about 20 to 40%. A film made of the photosensitive paste is formed on the substrate 11 through a screen printing method. A plate having the roughness of #400 is used to form the film in order to set the thickness of the photosensitive paste to 7 μm or more.

Thereafter, for the purpose of drying the photosensitive paste, drying is implemented at about 80 to 150° C. The thickness of the first layer 12 which has been dried is about 8 μm.

Subsequently, in FIG. 3B, a desired region of the first layer 12 is exposed by using the mask 13 having a desired pattern (opening portion).

In this situation, an exposure light 14 passes through the opening portion of the mask 13 and exposes the first layer 12 of the photosensitive paste as shown in the figure. Reference numeral 15 denotes a latent image which is an exposed portion of the photosensitive paste of the first layer 12.

Then, in FIG. 3C, the second layer 16 is formed in the same method as that of the first layer 12, and thereafter drying is implemented in the same manner as that of the first layer 12. The thickness of the first layer 12 and the second layer 16 which has been dried further increases by about 7 μm and is about 15 μm in total.

Then, in FIG. 3D, the second layer 16 is exposed by using the same mask 13 in the same manner as that of the process of exposing the first layer 12.

In this situation, exposure is made in such a manner that an exposed region of the first layer 12 is substantially superimposed on an exposed region of the second layer 16.

As shown in the figure, the exposure light 17 passes through the opening portion of the mask 13 and exposes the second layer 16 of the photosensitive paste. Reference numeral 18 denotes a latent image which is a portion of the photosensitive paste of the second layer that has been subjected to the second exposure.

In addition, in FIG. 3E, a third layer of the photosensitive paste (hereinafter referred to as "third layer") 21 is formed in the same manner as that of the second layer 16. Thereafter, drying is implemented in the same manner as that of the second layer 16. The thickness of the first layer 12, the second layer 16 and the third layer 21 which have been dried further increases by about 7 μm and is about 22 μm in total.

In addition, the third layer 21 is exposed by using the same mask 13 in the same method as that of the second layer 16 in FIG. 3F.

In this situation, exposure is made in such a manner that an exposed region of the second layer 16 is substantially superimposed on an exposed region of the third layer 21.

As shown in the figure, an exposure light 22 passes through an opening portion of the mask 13 and exposes the third layer 21 of the photosensitive paste. Reference numeral 23 denotes a latent image which is an exposed portion of the photosensitive paste of the third layer 21.

In this way, the film forming process and the exposure process are repeated three times, and the photosensitive paste having a height of about 22 μm is developed together in the state of the three-layer structure in FIG. 3G.

Developing is implemented in the same manner as that of the second embodiment to form the developing pattern 24 shown in the figure.

In addition, as shown in FIG. 3H, baking is made to form a desired wiring pattern (electroconductive film) 25. In this situation, baking is implemented at about 500° C. The thickness of the wiring pattern 25 which has been baked is about 14 μm and the line width is about 75 μm.

In this case, the lowest portion of the thickness of the wiring pattern 25 in its section is about 14 μm on the center portion whereas the highest portion is about 15 to 17 μm on the end portion. The wiring pattern 25 can be formed with about 1.1 to 1.2 times the curled amount of edge in a state where there is substantially no curling of edge.

In this way, the film forming process and the exposure process are repeated three times, and the developing process and the subsequent processes are proceeded together in the state of the three-layer structure, thereby being capable of remarkably reducing the curling of edge.

In this way, because the curing of edge is reduced, the generation of bubbles is reduced even if the insulating layer is formed on the wiring pattern 25, and the generation of the hole or the growth of the bubbles is reduced even in the laminate layer. Also, even if an electrode is further formed on the insulating layer, defects that lead to short-circuiting are remarkably reduced.

Also, because the curing of edge is reduced, the number of processes is not increased because the number of insulating layers which will be laminated by several layers on each other in a following process does not increase, and also an excessive step is not produced in formation of the upper-layer wiring.

Also, because the buildup of the curled edge portion is small even in the terminal portion, even if flexible mounting is conducted, the curled edge portion is not damaged, and the contact failure does not occur.

Also, there arises no problem that the line of the wiring pattern 25 is cracked even if the flexible board is replaced by a new one.

(Fourth Embodiment)

Figure 4A:
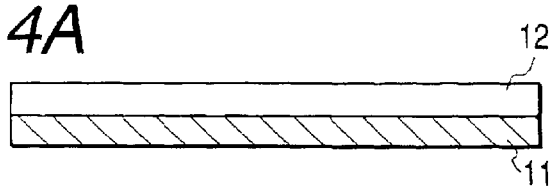
FIGS. 4A, 4B, 4C, 4D, 4E and 4F are diagrams showing processes of a method of manufacturing a wiring in accordance with a fourth embodiment of the present invention.
Figure 4B:
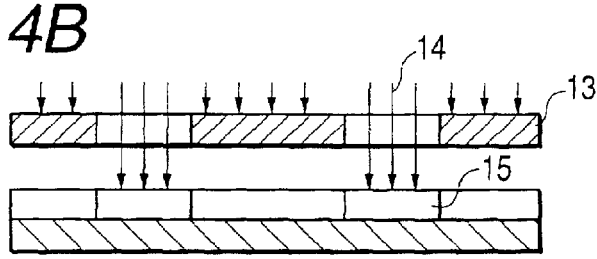
Figure 4C:
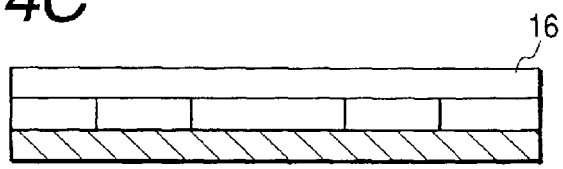
Figure 4D:
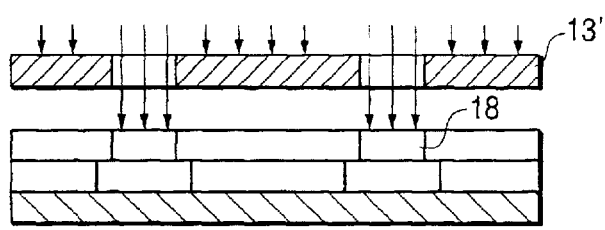
Figure 4E:
Figure 4F:

FIGS. 4A to 4F are schematic views showing a process of manufacturing a wiring in accordance with a fourth embodiment. FIG. 4A is a diagram showing a state in which a photosensitive paste film has been formed; FIG. 4B is a diagram showing a state in which exposure has been made; FIG. 4C is a diagram showing a state in which a second layer film has been formed; FIG. 4D is a diagram showing a state in which the second layer has been exposed; FIG. 4E is a diagram showing a state in which developing has been made; and FIG. 4F is a diagram showing a state in which baking has been made.

Referring to FIGS. 4A to 4F, reference numeral 11 denotes a substrate; 12 and 16 denote first and second layers each formed by coating a photosensitive paste on the substrate 11; 13 and 31 denote masks; 14 and 17 denote exposure lights; 15 and 18 denote latent images; 19 denotes a developing pattern; and 20 denotes a wiring pattern (electroconductive film).

In this embodiment, the masks 13 and 31 used in the processes of FIGS. 4B and 4D are different from each other, and more particularly the opening width is different between the masks 13 and 31. The wiring is fabricated in the same method as that of the second embodiment except that the narrower mask 31 is used, and the developing pattern 19 different in the upper and lower line widths is finally fabricated as shown in FIG. 4E.

In addition, as shown in FIG. 4F, a desired wiring pattern (electroconductive film) 20 is formed by baking. In this situation, baking is implemented at about 500° C. The thickness of the wiring pattern 20 which has been baked is about 14 μm, and the line width at the lower side is about 75 μm.

In this case, the lowest portion of the thickness of the wiring pattern 20 in its section is about 14 μm on the center portion of the second layer 16 whereas the highest portion is about 17 μm on the end portion of the second layer 16. The wiring pattern 20 can be formed with about 1.2 times the curled amount of edge.

In this way, the film forming process and the exposure process are repeated twice, and the developing process and the subsequent processes are proceeded together in the state of the two-layer structure, thereby being capable of remarkably reducing the curling of edge.

In this way, because the curing of edge is reduced, the generation of bubbles is reduced even if the insulating layer is formed on the wiring pattern 20, and the generation of the hole or the growth of the bubbles is reduced even in the laminate layer. Also, even if an electrode is further formed on the insulating layer, defects that lead to short-circuiting are remarkably reduced.

Also, because the curing of edge is reduced, the number of processes is not increased because the number of insulating layers which will be laminated by several layers on each other in a following process does not increase, and also an excessive step is not produced in formation of the upper-layer wiring.

Also, because the buildup of the curled edge portion is small even in the terminal portion, even if flexible mounting is conducted, the curled edge portion is not damaged, and the contact failure does not occur.

Also, there arises no problem that the line of the wiring pattern 20 is cracked even if the flexible board is replaced by a new one.

(Fifth Embodiment)

Figure 5A:
FIGS. 5A, 5B, 5C, 5D, 5E, 5F, 5G and 5H are diagrams showing processes of a method of manufacturing a wiring in accordance with a fifth embodiment of the present invention.
Figure 5B:
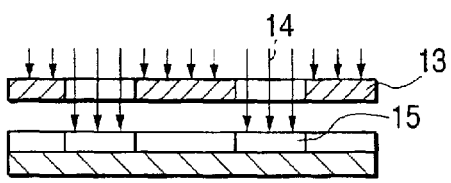
Figure 5C:
Figure 5D:
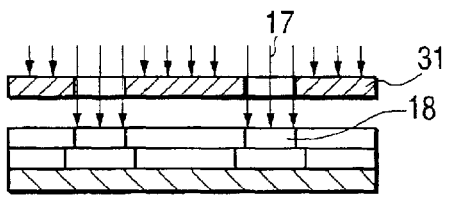
Figure 5E:
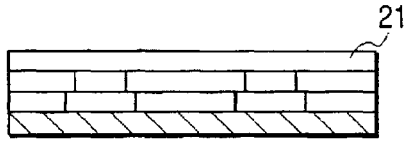
Figure 5F:
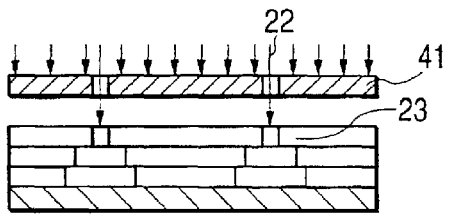
Figure 5G:
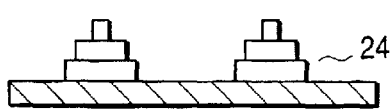
Figure 5H:

FIGS. 5A to 5H are schematic views showing a process of manufacturing a wiring in accordance with a fifth embodiment. FIG. 5A is a diagram showing a state in which a photosensitive paste film has been formed; FIG. 5B is a diagram showing a state in which exposure has been made; FIG. 5C is a diagram showing a state in which a second layer film has been formed; FIG. 5D is a diagram showing a state in which the second layer has been exposed; FIG. 5E is a diagram showing a state in which a third layer has been formed; FIG. 5F is a diagram showing a state in which the third layer has been exposed; FIG. 5G is a diagram showing a state in which developing has been made; and FIG. 5H is a diagram showing a state in which baking has been made.

Referring to FIGS. 5A to 5H, reference numeral 11 denotes a substrate; 12, 16 and 21 denote first, second and third layers each formed by coating a photosensitive paste on the substrate 11; 13, 31 and 41 denote masks; 14, 17 and 22 denote exposure lights; 15, 18 and 23 denote latent images; 24 denotes a developing pattern; and 25 denotes a wiring pattern.

In this embodiment, the masks 13, 31 and 41 used in the processes of FIGS. 5B, 5D and 5F are different from each other, and more particularly, the opening width is different between the masks 13, 31 and 41. The wiring is fabricated in the same method as that of the third embodiment except that the narrower masks are used in order, and the developing pattern 24 different in the upper, middle and lower line widths is finally fabricated as shown in FIG. 5G.

In addition, as shown in FIG. 5H, a desired wiring pattern 25 is formed by baking. In this situation, baking is implemented at about 500° C.

The thickness of the wiring pattern 25 which has been baked is about 14 μm, and the line width at the lowest side is about 75 μm. In this case, the lowest portion of the thickness of the wiring pattern 25 in its section is about 14 μm on the center portion whereas the highest portion is about 16 μm on the end portion. The wiring pattern 25 can be formed with about 1.2 times the curled amount of edge.

In this way, the film forming process and the exposure process are repeated three times, and the developing process and the subsequent processes are proceeded together in the state of the three-layer structure, thereby being capable of remarkably reducing the curling of edge.

In this way, because the curing of edge is reduced, the generation of bubbles is reduced even if the insulating layer is formed on the wiring pattern 25, and the generation of the hole or the growth of the bubbles is reduced even in the laminate layer. Also, even if an electrode is further formed on the insulating layer, defects that lead to short-circuiting are remarkably reduced.

Also, because the curing of edge is reduced, the number of processes is not increased because the number of insulating layers which will be laminated by several layers on each other in a following process does not increase, and also an excessive step is not produced in formation of the upper-layer wiring.

Also, because the buildup of the curled edge portion is small even in the terminal portion, even if flexible mounting is conducted, the curled edge portion is not damaged, and the contact failure does not occur.

Also, there arises no problem that the line of the wiring pattern 25 is cracked even if the flexible board is replaced by a new one.

(Sixth Embodiment)

Figure 6A:
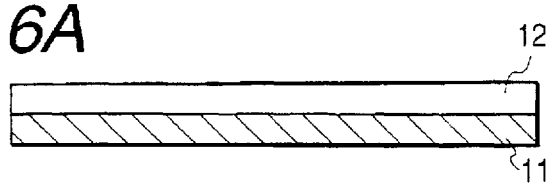
FIGS. 6A, 6B, 6C, 6D, 6E and 6F are diagrams showing processes of a method of manufacturing a wiring in accordance with an sixth embodiment of the present invention.
Figure 6B:
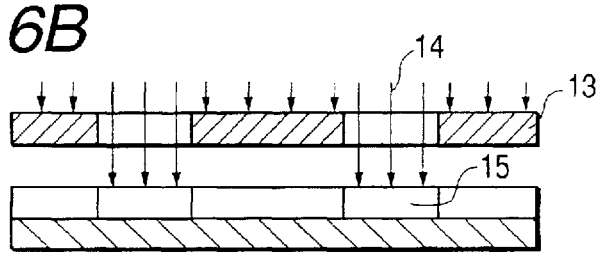
Figure 6C:
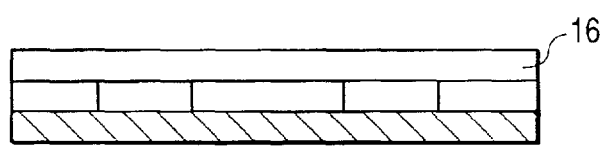
Figure 6D:
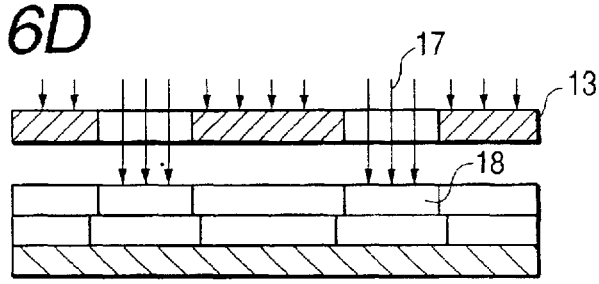
Figure 6E:
Figure 6F:

FIGS. 6A to 6F are schematic views showing a process of manufacturing a wiring in accordance with an sixth embodiment. As in the second embodiment, FIG. 6A is a diagram showing a state in which a photosensitive paste film has been formed; FIG. 6B is a diagram showing a state in which exposure has been made; FIG. 6C is a diagram showing a state in which a second layer film has been formed; FIG. 6D is a diagram showing a state in which the second layer has been exposed; FIG. 6E is a diagram showing a state in which developing has been made; and FIG. 6F is a diagram showing a state in which baking has been made.

In this embodiment, in FIGS. 6B and 6D showing the exposure processes, the same mask 13 is used, but a distance between the mask 13 at the time of exposure and a photosensitive paste film surface is different between the exposure processes of FIGS. 6B and 6D. That is, the distance in FIG. 6B is longer than that in FIG. 6D and is set to about 500 $\mu$m, and the distance in FIG. 6D is set to about 100 $\mu$m. The wiring is formed in the same method as that in the second embodiment except for that distance.

With the above structure, as shown in FIG. 6E, the line width of the pattern that has been developed is so designed as to form the developing pattern 19 whose upper line width is narrower than the lower line width.

Further, the developing pattern 19 is baked to fabricate the wiring pattern 20 as shown in FIG. 6F. In this situation, the baking is implemented at about 500° C. The thickness of the wiring pattern 20 which has been baked is about 14 $\mu$m, the line width is about 75 $\mu$m at the lower side and about 65 $\mu$m at the upper side.

In this case, the lowest portion of the thickness of the wiring pattern 20 in its section is about 14 $\mu$m on the center portion whereas the highest portion is about 17 $\mu$m on the end portion. The wiring pattern 20 can be formed with about 1.2 times the curled amount of edge.

According to this embodiment, since the line width of each layer of the photosensitive paste can be changed by one mask 13, there are obtained an intended effect that the curled edge is suppressed, and the advantage that it is unnecessary to prepare a plurality of masks.

In this way, because the curing of edge is reduced, the generation of bubbles is reduced even if the insulating layer is formed on the wiring pattern 20, and the generation of the hole or the growth of the bubbles is reduced even in the laminate layer. Also, even if an electrode is further formed on the insulating layer, defects that lead to short-circuiting are remarkably reduced.

Also, because the curing of edge is reduced, the number of processes is not increased because the number of insulating layers which will be laminated by several layers on each other in a following process does not increase, and also an excessive step is not produced in formation of the upper-layer wiring.

Also, because the buildup of the curled edge portion is small even in the terminal portion, even if flexible mounting is conducted, the curled edge portion is not damaged, and the contact failure does not occur.

Also, there arises no problem that the line of the wiring pattern 20 is cracked even if the flexible board is replaced by a new one.

(Seventh Embodiment)

In a seventh embodiment, an electron source and an image-forming apparatus are formed by using the method of manufacturing a wiring in accordance with the above second embodiment.

Hereinafter, a method of manufacturing an electron source and an image-forming apparatus in accordance with this embodiment will be described with reference to FIGS. 7A, 7B, 8A, 8B, 9A, 9B and 10.

(1) There is prepared a substrate 11 which is a rear plate in which SiO$_2$ is formed in the thickness of 0.5 $\mu$m on the surface of a soda lime glass through a sputtering method.

Figure 7A:
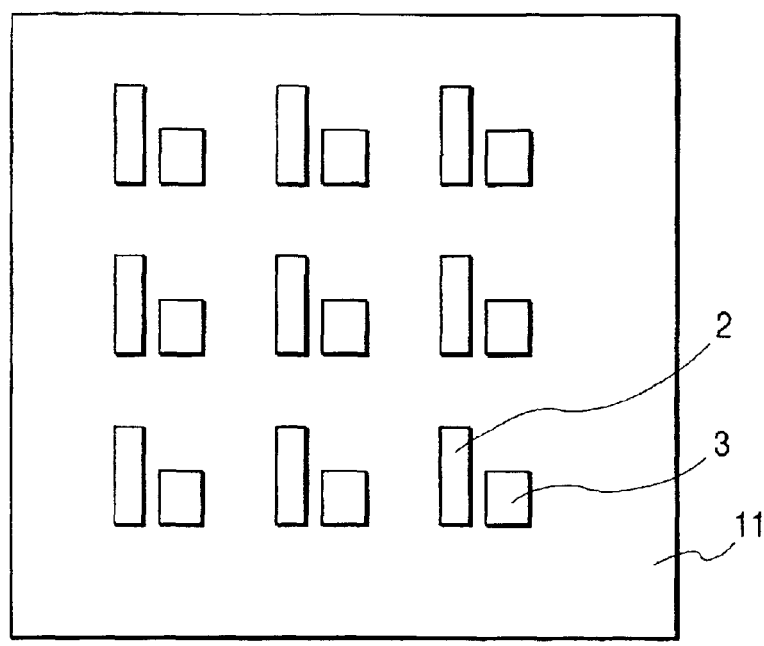
FIGS. 7A and 7B are diagrams showing processes of a method of manufacturing an electron source in accordance with a seventh embodiment of the present invention.

(2) A pair of electrodes 2 and 3 are formed on the surface of the soda lime glass on which SiO$_2$ is formed by 1000 pairs in an X-direction and 5000 pairs in a Y-direction (FIG. 7A).

Figure 7B:
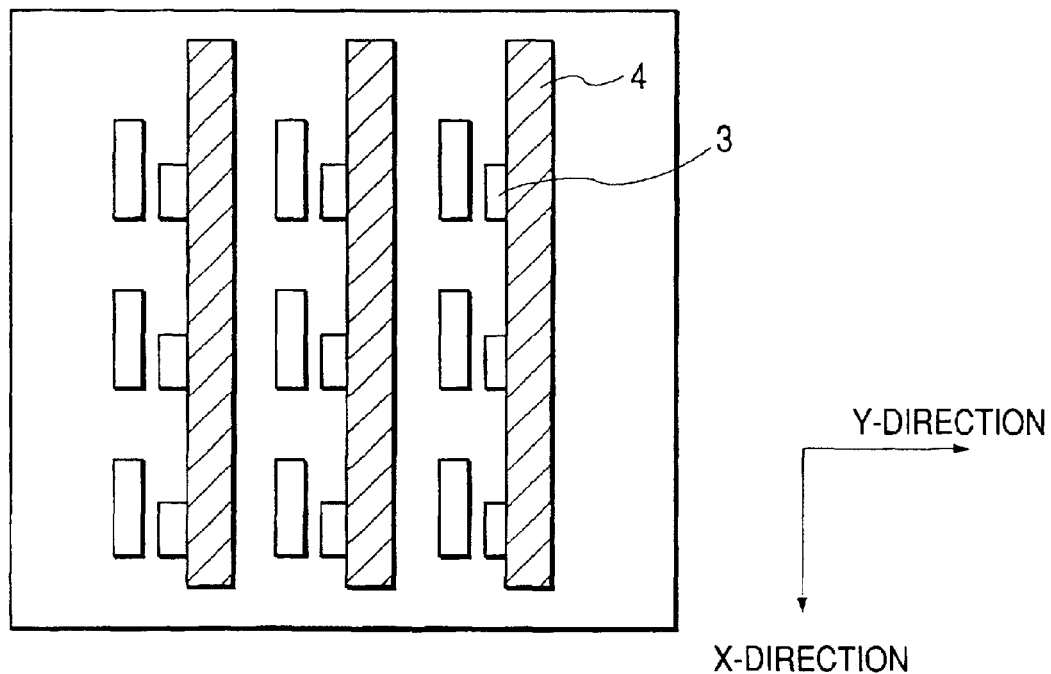

For simplification of description, FIGS. 7A and 7B show 9 pairs of electron-emitting devices in total consisting of 3 pairs of electron-emitting devices in the X-direction and 3 pairs of electron-emitting devices in the Y-direction.

In this embodiment, the electrodes 2 and 3 are made of Pt. Also, the electrodes 2 and 3 are formed through a photolithography method. The intervals between the electrodes 2 and the electrodes 3 are set to 20 $\mu$m.

(3) A photosensitive paste is coated on the entire surface of the substrate 11 of the rear plate on which the electrodes 2 and 3 are formed in the same manner as that in the second embodiment to form the first layer 12 made of the photosensitive paste (see FIG. 2A).

Note that, the photosensitive paste used in this embodiment is identical with that used in the second embodiment. That is, the photosensitive paste is made of Ag grains as the electroconductive material, acrylic resin which is a photosensitive organic material that cures in response to ultraviolet rays in addition to glass filler and the like.

(4) Thereafter, the first layer 12 made of the photosensitive paste is dried, and an ultraviolet exposure light 14 is irradiated (exposed) onto the dried first layer 12 by using a light shielding mask 13 having a plurality of stripe-shaped openings (see FIG. 2B).

(5) Then, the photosensitive paste used in the above process (3) is further coated on the first layer 12 having an exposed region 15 and a non-exposed region to form the second layer 16 made of the photosensitive paste (see FIG. 2C).

(6) Thereafter, the second layer 16 is dried, and an ultraviolet exposure light 17 is irradiated (exposed) onto the dried second layer 16 by using the light shielding mask 13 having a plurality of stripe-shaped openings (see FIG. 2D).

Note that, in this process (6), the exposure is conducted such that a region 18 which the second layer 16 has exposed is substantially superimposed on the region 15 which has been exposed in the above-mentioned process (4).

(7) Subsequently, the substrate 11 of the rear plate is washed by an organic solvent to remove (develop) the non-exposed portions of the first layer 12 and the second layer 16 together, thereby forming the developing pattern 19 (FIG. 2E).

(8) In addition, the substrate 11 of the rear plate is baked to form 500 column-directional wirings 4 each having the width of 50 $\mu$m at the pitches of 180 $\mu$m as the wiring pattern 20 shown in FIG. 2F (FIG. 7B). Because a part of the electrodes 3 is covered with the column-directional wirings 4 through the process (8), the electrodes 3 and the column-directional wirings 4 are connected to each other.

Figure 8A:
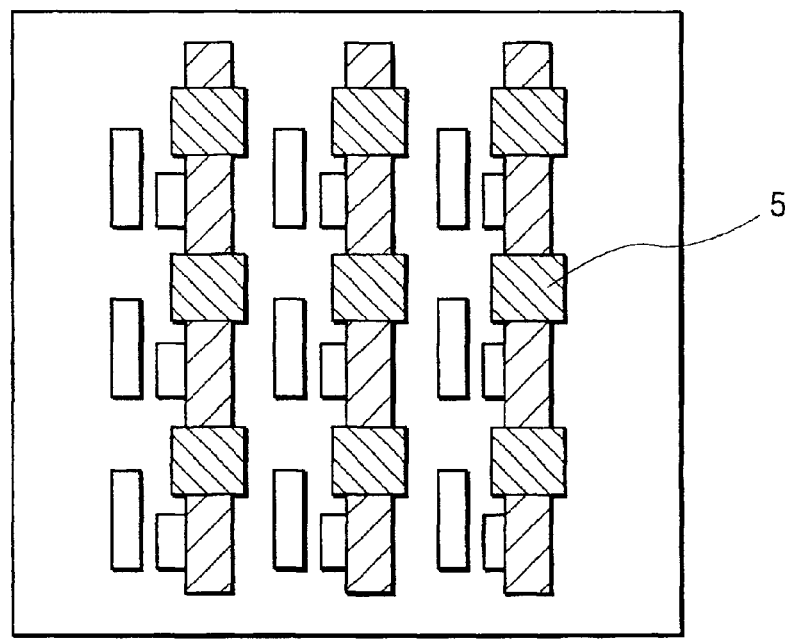
FIGS. 8A and 8B are diagrams showing processes of a method of manufacturing an electron source in accordance with the seventh embodiment of the present invention.

(9) Then, an insulating paste containing glass binder and resin is coated on the respective cross portions of the row-directional wirings 6 which will be formed in a succeeding process and the column-directional wirings 4 that have been already formed through the printing method, and then baked to form the insulating layer 5 (FIG. 8A).

Figure 8B:
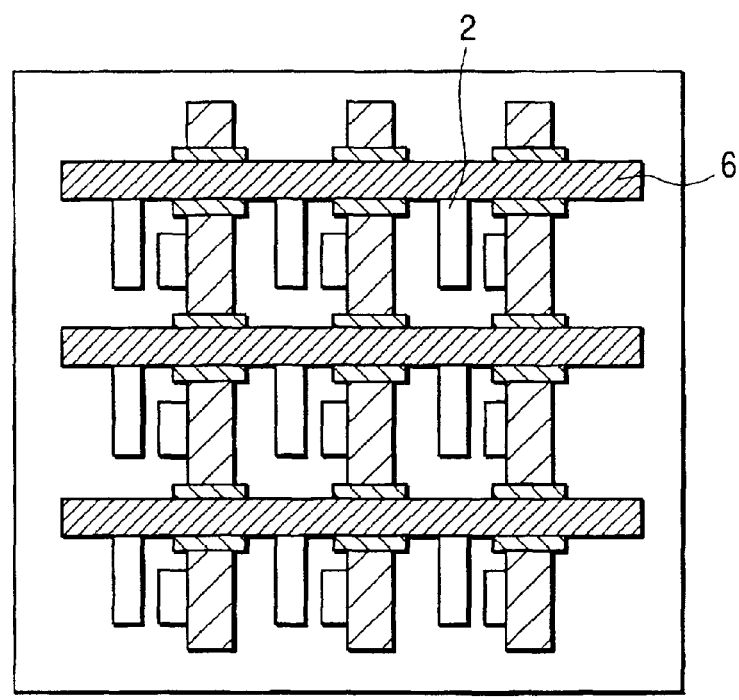

(10) A paste containing Ag grains, glass binder and resin therein is coated in a linear pattern by using the screen printing method, and then baked to form 1000 row-directional wirings 6 (FIG. 8B). Because a part of the electrodes 2 is covered with the row-directional wirings 6 in this process 10, the electrodes 2 and the row-directional wirings 6 are connected to each other.

The row-directional wirings 6 are formed in such a manner that their widths are 150 µm and their interval pitches are 500 µm.

Figure 9A:
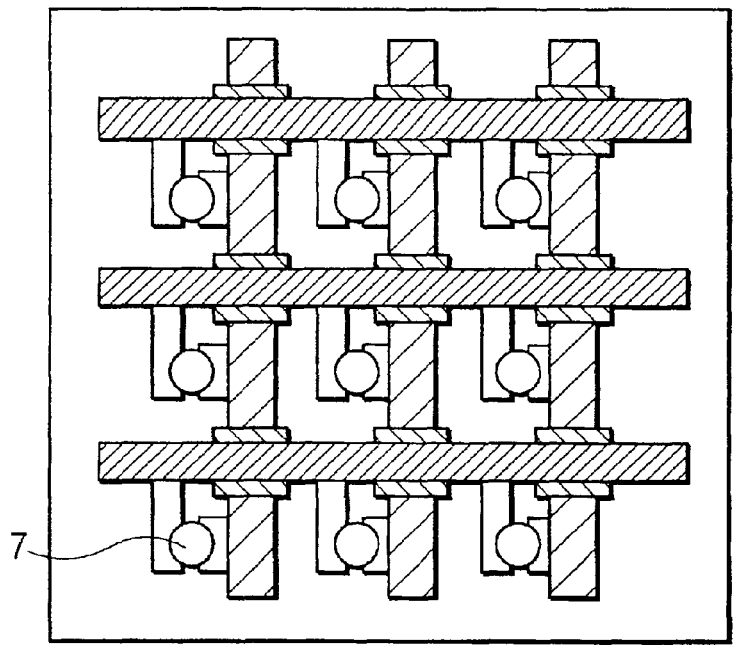
FIGS. 9A and 9B are diagrams showing processes of a method of manufacturing an electron source in accordance with the seventh embodiment of the present invention.

(11) Then, an aqueous solution containing Pd therein is given to all gaps between the respective electrodes 2 and 3. Then, the product is baked under the atmosphere at 350° C., to thereby form the electron-emitting electroconductive film 7 made of PdO (FIG. 9A).

In this embodiment, an ink jet device of the piezoelectric system is employed which is one of the ink jet techniques to give the above ink. In this embodiment, as the ink containing Pd therein, there is used an aqueous solution containing an organic Pd compound 0.15%, isopropyl alcohol 15%, ethylene glycol 1%, and polyvinyl alcohol 0.05%.

The electron source substrate (rear plate) before forming is formed by the above process.

(12) The electron source substrate before forming which is fabricated in the above-mentioned process is disposed within a vacuum chamber, and after a gas is exhausted from the chamber down to $10^{-4}$ Pa, the respective row-dimensional wirings 4 are set to 0 V, and a pulsed voltage is sequentially applied to the row-directional wirings 6 in a state where hydrogen is introduced into the chamber as a forming process. Through this process, a current is allowed to flow in the respective electron-emitting electroconductive films 7 to define a gap in a part of the respective electron-emitting electroconductive films 7.

Note that, in the forming process, a constant voltage pulse of 5 V is repeatedly applied.

The voltage waveform is a chopping wave whose pulse width and pulse interval are 1 msec and 10 msec, respectively. The energization forming process is completed when the resistance of the electron-emitting electroconductive film 7 is 1 MΩ or more.

Figure 9B:
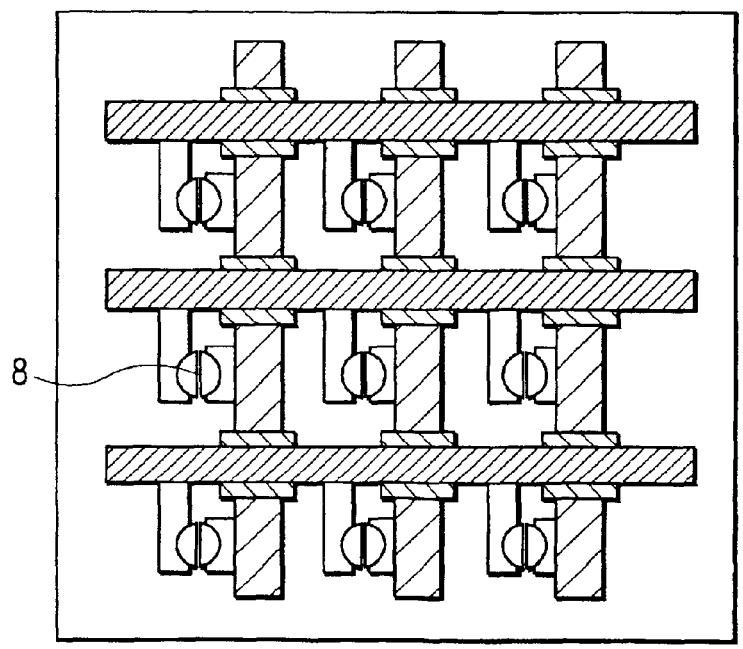

(13) The device that has been subjected to the forming process is then subjected to a process called "activation process". After a gas is exhausted from the chamber down to $10^{-6}$ Pa, benzonitrile of $1.3 \times 10^{-4}$ Pa is introduced into the chamber, and the respective column-directional wirings 4 are set to 0 V, and a pulsed voltage is sequentially repeatedly applied to the row-directional wirings 6 as an activation process. Through the process, carbon films are formed on an inside of the gap of the electron-emitting electroconductive film 7 that has been formed in the forming process and a film in the vicinity of the gap to form an electron-emitting portion 8 (FIG. 9B).

In the activation process, a pulse voltage of a rectangular wave having a pulse peak value of 15 V, a pulse width of 1 msec and a pulse interval of 10 msec is applied to the respective devices.

Figure 10:
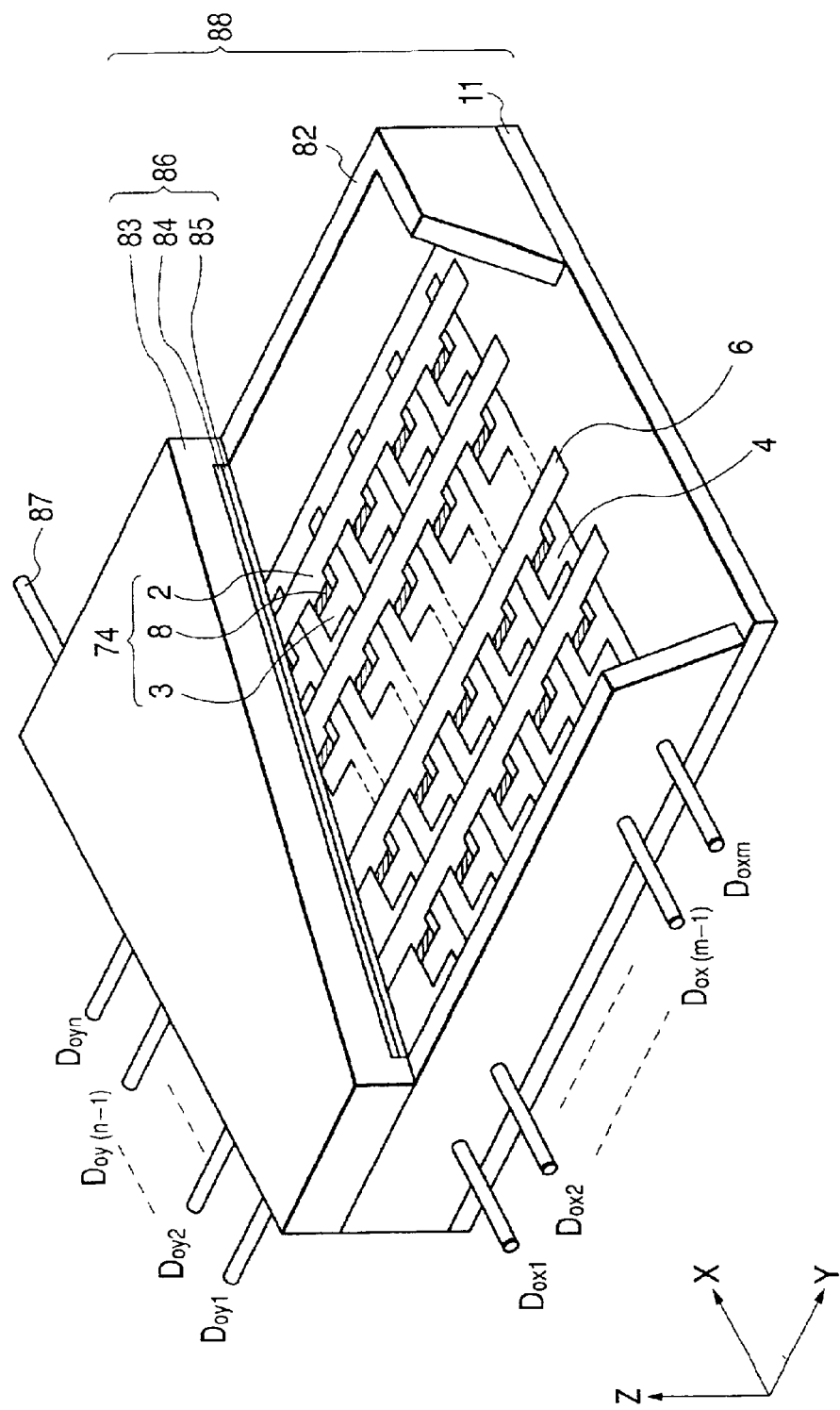
FIG. 10 is a schematic structural view showing an image-forming apparatus in accordance with the seventh embodiment of the present invention.
Figure 11A:
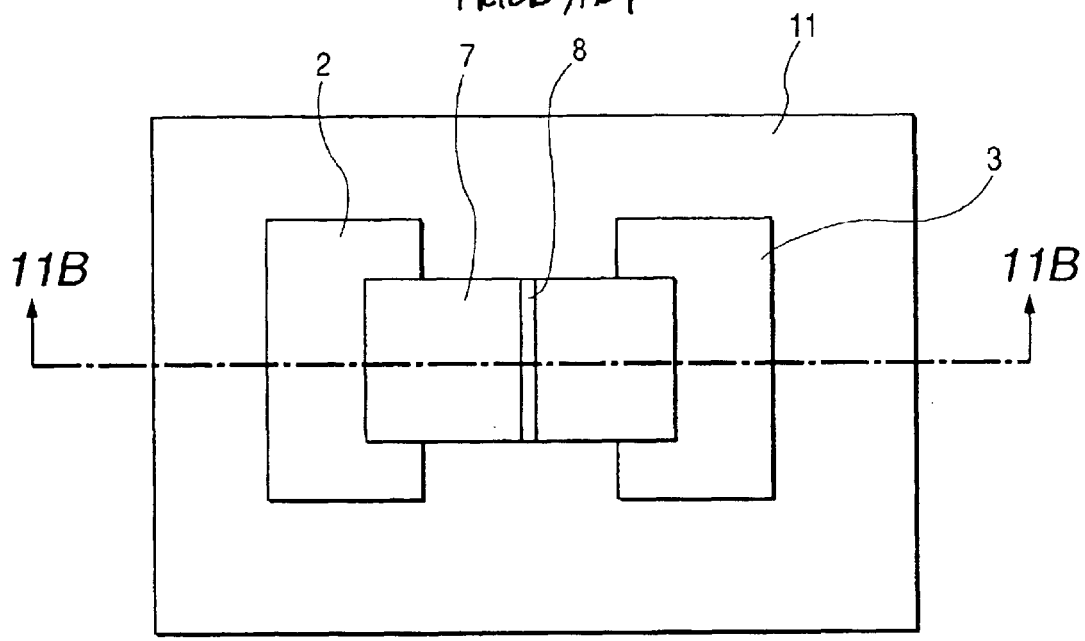
FIGS. 11A and 11B are schematic views showing an example of a surface conduction electron-emitting device.
Figure 11B:
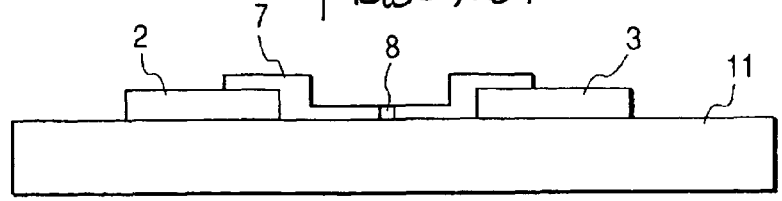

Through the above process, the substrate 11 of the electron source (rear plate) on which a plurality of electron-emitting devices 74 shown in FIG. 10 are arranged is fabricated.

As a result of evaluating the electric characteristic of the electron source substrate, the insulating property of the column-directional wirings 4 and the row-directional wirings 6 is satisfactorily ensured.

Then, a method of preparing the face plate 86 shown in FIG. 10 will be described.

(14) First, the face plate substrate 83 made of the same material as that of the substrate 11 of the rear plate is sufficiently washed and dried. Thereafter, a black member is formed on the substrate 83 through the photolithography method.

Here, the black member is formed in a lattice-like fashion so as to provide openings in correspondence with portions where the respective color phosphors are arranged. The pitches of the black member in the Y-direction is identical with the pitches of the column-directional wirings 4, and the pitches of the black member in the X-direction is identical with the pitches of the row-directional wirings 6.

(15) The respective color phosphors of red, blue and green are formed on the opening portions of the black member through the screen printing method.

(16) In addition, a filming layer is formed on the black member and the phosphors. As a material of the filming layer, a polymethacrylate resin is dissolved in an organic solvent and coated through the screen printing method and then dried.

(17) Subsequently, Al is formed on the filming layer through the evaporation method.

(18) Thereafter, the face plate 86 is heated to remove the resin contained in the phosphor paste and the filming layer to obtain the face plate 86 where the image forming member 84 that is a phosphor layer consisting of the phosphor and the black member and the metal back 85 are formed on the substrate 83.

(19) An outer frame 82 on which a spacer (not shown) having a high resistant film on its surface and a joint member are disposed in advance is arranged between the substrate 11 of the rear plate formed through the above process and the face plate 86.

Then, the joint member is heated and pressurized in vacuum in a state where the face plate 86 and the rear plate 11 are satisfactorily positioned to soften the joint member so that the respective members are joined together. Through this sealing process, an envelop (display panel) 88 shown in FIG. 10 as the image-forming apparatus whose interior is maintained in a high vacuum is obtained.

The high resistant film disposed on the surface of the spacer is disposed to escape the charges stored on the spacer surface by irradiating electrons onto the spacer surface to the row-directional wirings 6 or a metal back 85.

Also, the reason that the spacer is abutted against the row-directional wirings (wirings to which a scanning signal is applied) 6 is because the trajectory of electron beams emitted from a lateral electron-emitting device is prevented from being shielded.

In addition, another reason is because the alignment of the spacer and the row-directional wirings is readily conducted.

A drive circuit is connected to lead-out wiring portions lead out from the interior of a display panel 88 obtained in the above manner through a flexible board to display a moving picture by linear sequential scanning.

Note that, in this embodiment, a scanning signal is applied to the column-directional wiring 6 which is wider in the sectional area of the wiring, and a modulation signal is applied to the column-directional wirings 4.

As a result of displaying the moving picture on the display panel 88, a very high precision and high-luminance image is obtained for a long period of time. Also, even if the flexible board is connected to the lead-out portions of the row-directional wirings 6 and the column-directional wirings 4, no crack of the wiring occurs. Also, no pixel defect caused by the discharge phenomenon occurs.

Figure 12:
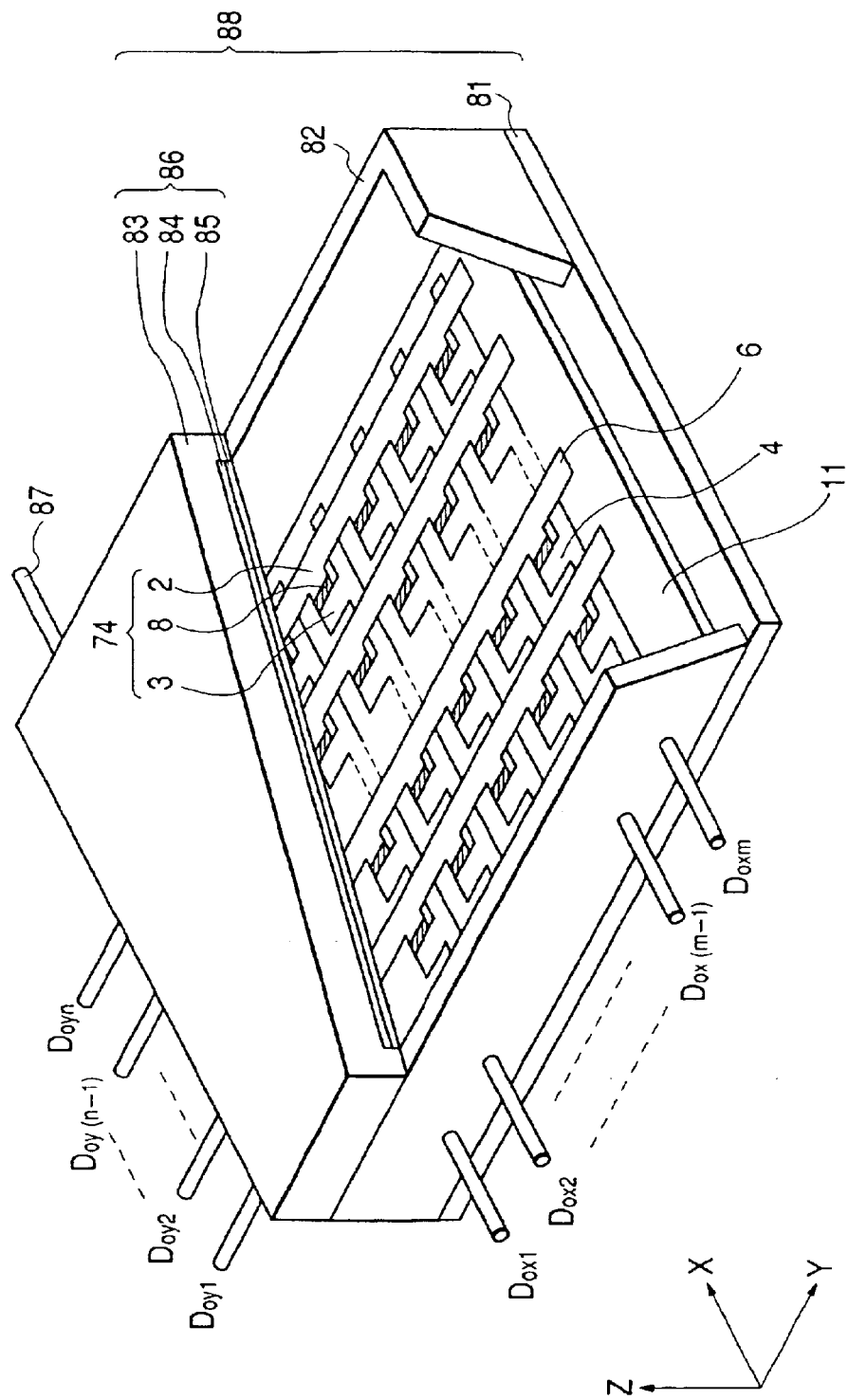
FIG. 12 is a schematic structural view showing a conventional image-forming apparatus.
Figure 13A:
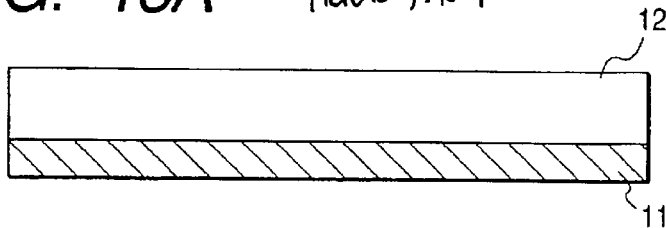
FIGS. 13A, 13B, 13C and 13D are diagrams showing processes of a method of manufacturing a wiring in a conventional art.
Figure 13B:
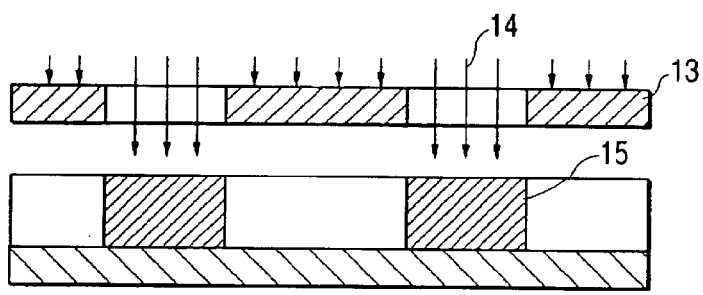
Figure 13C:
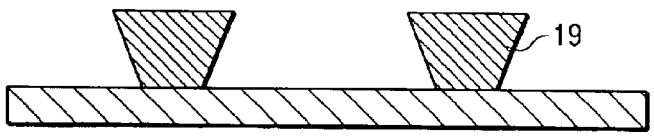
Figure 13D:

Note that, the display panel 88 may be structured by using a substrate 81 of the rear plate that fixes the substrate 11 in addition to the substrate 11 as in the conventional art shown in FIG. 12.

As was described above, according to the present invention, it is possible to fabricate the electroconductive film that reduces the curling of the edge. For that reason, in the case of using the electroconductive film as a wiring, a factor that bubbles are contained in the electroconductive film when the insulating layer is laminated on the wiring which is implemented in a following process is eliminated, thereby being capable of preventing the inter-layer insulating characteristic from being deteriorated to improve the insulating property.

Also, because the curling of edge of the electroconductive film is reduced, it is unnecessary to excessively increase the number of insulating layers which is implemented in the following process. For that reason, when an upper-layer wiring is further formed on the insulating layer, no excessive step occurs.

In addition, because the buildup of the curled edge portion is small even on the wiring lead-out portion, even if flexible mounting is conducted, a damage on the curled edge portion and a contact failure do not occur. Also, there arises no problem that the line of a thick wiring is cracked even if the flexible board is replaced by a new one.

For the above reasons, the pixel defect caused by the discharge phenomenon does not occur in a large-screen and flat image-forming apparatus having the electron-emitting devices and becomes high in performance.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing an electroconductive film subject to edge curl due to volume contraction after baking, comprising the steps of:

forming a film containing a photosensitive material and an electroconductive material therein on a substrate;

conducting an exposure to form a latent image on a desired region of the film formed in the film forming step by exposing the entire wider portion of the desired region and, thereafter, exposing an overlapping narrower center portion of the desired region;

conducting a development to form a development image of the film by removing a non-latent image region of the film after said exposing step; and baking the development image formed in said developing step whereby the steps of exposing the entire wider portion and thereafter exposing the overlapping narrower center portion counteract edge curl formed by volume contraction after the baking step.

2. A method according to claim 1, wherein the step of conducting the exposure comprises a first single exposure of the entire wider portion of the desired region and a second single exposure of the overlapping center portion of the desired region.

3. A method according to claim 2, wherein an opening region of an opening portion of a mask having said opening portion for irradiating a light onto a desired region of said film is changed to a different size between the first wider portion exposure to form a wider portion latent image and the second overlapping center portion exposure to form a second overlapping center portion image.

4. A method according to claim 2, wherein a distance between a mask having an opening portion for irradiating a light onto a desired region of said film and said film is changed to form differently sized latent images between the first wider portion exposure to form a wider portion latent image and the second overlapping center portion exposure to form a second overlapping center portion latent image.

5. A method according to claim 1, wherein a film thickness after said baking step is 5–10 $\mu$m.

6. A method of manufacturing an image apparatus comprising the steps of:

forming first and second wirings in a matrix according to the electroconductive film manufacturing method recited in claim 1 so that an insulating layer is interposed between the first and second wirings at an intersection of the first and second wirings;

forming an electron emission element at the intersection of the first and second wirings; and providing an image forming member which forms an image by using electrons emitted from the electron emission element.

7. A method according to claim 1, wherein said film fanning step coats a paste containing said photosensitive material and said electroconductive material therein on said substrate.

8. A method according to claim 1, wherein said electroconductive material is metal.

9. A method according to claim 1, wherein said electroconductive material is electroconductive grains.

* * * * *

UNITED STATES PATENT AND TRADEMARK OFFICE
CERTIFICATE OF CORRECTION

PATENT NO. : 6,962,770 B2 Page 1 of 1
DATED : November 8, 2005
INVENTOR(S) : Yoshimi Uda et al.

It is certified that error appears in the above-identified patent and that said Letters Patent is hereby corrected as shown below:

<u>Title page,</u>
Item [56], References Cited, FOREIGN PATENT DOCUMENTS,
"06077106 A" should read -- 6-77106 A --.
"08227153 A" should read -- 8-227153 A --.

<u>Column 6,</u>
Line 17, "with" should read -- as --.

<u>Column 18,</u>
Line 35, "image apparatus" should read -- image forming apparatus --.

Signed and Sealed this

Twenty-first Day of March, 2006

JON W. DUDAS
*Director of the United States Patent and Trademark Office*